(12) United States Patent
Shimotsusa et al.

(10) Patent No.: US 9,881,957 B2
(45) Date of Patent: Jan. 30, 2018

(54) PHOTOELECTRIC CONVERSION DEVICE, IMAGE PICKUP SYSTEM AND METHOD OF MANUFACTURING PHOTOELECTRIC CONVERSION DEVICE

(71) Applicant: CANON KABUSHIKI KAISHA, Tokyo (JP)

(72) Inventors: Mineo Shimotsusa, Machida (JP); Takeshi Ichikawa, Hachioji (JP); Yasuhiro Sekine, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/155,931

(22) Filed: May 16, 2016

(65) Prior Publication Data

US 2016/0260763 A1 Sep. 8, 2016

Related U.S. Application Data

(60) Continuation of application No. 14/685,337, filed on Apr. 13, 215, now Pat. No. 9,368,544, which is a
(Continued)

(30) Foreign Application Priority Data

Feb. 29, 2012 (JP) ................................ 2012-043962

(51) Int. Cl.
*H01L 27/146* (2006.01)
*H01L 31/024* (2014.01)
*H01L 23/00* (2006.01)

(52) U.S. Cl.
CPC ........ *H01L 27/14634* (2013.01); *H01L 24/05* (2013.01); *H01L 27/1469* (2013.01);
(Continued)

(58) Field of Classification Search
CPC ............... H01L 24/05; H01L 27/14634; H01L 27/14621; H01L 27/1469; H01L 27/14687; H01L 27/14618; H01L 31/024
See application file for complete search history.

(56) References Cited

U.S. PATENT DOCUMENTS 8,154,098 B2 * 4/2012 Yang ................. H01L 27/14634
257/222
2006/0146233 A1 7/2006 Park
(Continued)

FOREIGN PATENT DOCUMENTS

CN 101299433 A 11/2008
CN 102054849 A 5/2011
(Continued)

OTHER PUBLICATIONS

Ryuji Nishide; "Notification of Reasons for Refusal;" for Patent Application No. 2012-043962; dated Jul. 5, 2016; pp. 1-10.
(Continued)

*Primary Examiner* — Allan R Wilson
(74) *Attorney, Agent, or Firm* — Canon USA, Inc., IP Division

(57) ABSTRACT

A photoelectric conversion device includes a first semiconductor substrate including a photoelectric conversion unit for generating a signal charge in accordance with an incident light, and a second semiconductor substrate including a signal processing unit for processing an electrical signal on the basis of the signal charge generated in the photoelectric conversion unit. The signal processing unit is situated in an orthogonal projection area from the photoelectric conversion unit to the second semiconductor substrate. A multilayer film including a plurality of insulator layers is provided between the first semiconductor substrate and the second semiconductor substrate. The thickness of the second semiconductor substrate is smaller than 500 micrometers. The
(Continued)

thickness of the second semiconductor substrate is greater than the distance from the second semiconductor substrate and a light-receiving surface of the first semiconductor substrate.

22 Claims, 6 Drawing Sheets

Related U.S. Application Data continuation of application No. 14/514,090, filed on Oct. 14, 2014, now Pat. No. 9,029,241, which is a division of application No. 13/774,150, filed on Feb. 22, 2013, now Pat. No. 8,890,331.

(52) U.S. Cl.
 CPC .. *H01L 27/14618* (2013.01); *H01L 27/14621* (2013.01); *H01L 27/14687* (2013.01); *H01L 31/024* (2013.01); H01L 2224/02166 (2013.01); H01L 2224/04042 (2013.01); H01L 2224/48463 (2013.01); H01L 2924/12042 (2013.01); H01L 2924/12043 (2013.01); H01L 2924/13091 (2013.01); H01L 2924/351 (2013.01)

(56) References Cited

U.S. PATENT DOCUMENTS

| | | | |
|---|---|---|---|
| 2008/0316344 A1 | 12/2008 | Yamamiya | |
| 2009/0011534 A1 | 1/2009 | Yamamoto | |
| 2009/0184387 A1* | 7/2009 | Takeuchi | H01L 27/14687 257/440 |
| 2009/0275165 A1 | 11/2009 | Pourquier | |
| 2010/0164036 A1* | 7/2010 | Kim | H01L 27/1463 257/432 |
| 2010/0167447 A1* | 7/2010 | Kim | H01L 27/1464 438/59 |
| 2010/0181637 A1* | 7/2010 | Harada | H01L 27/14621 257/459 |
| 2010/0238331 A1 | 9/2010 | Umebayashi | |
| 2011/0024867 A1* | 2/2011 | Tseng | H01L 24/05 257/459 |
| 2011/0062434 A1* | 3/2011 | Eguchi | H01L 27/12 257/43 |
| 2011/0102657 A1* | 5/2011 | Takahashi | H01L 31/18 348/308 |
| 2011/0157445 A1 | 6/2011 | Itonaga | |
| 2012/0056288 A1* | 3/2012 | Yoshihara | H01L 23/49805 257/431 |
| 2012/0248580 A1* | 10/2012 | Matsugai | H01L 22/12 257/621 |
| 2012/0293698 A1 | 11/2012 | Sukegawa | |
| 2013/0105924 A1 | 5/2013 | Kobayashi | |

FOREIGN PATENT DOCUMENTS

| | | |
|---|---|---|
| CN | 102110700 A | 6/2011 |
| JP | 2002-231974 A | 8/2002 |
| JP | 2002231974 A | 8/2002 |
| JP | 2005-045125 A | 2/2005 |
| JP | 2005045125 A | 2/2005 |
| JP | 2005150463 A | 6/2005 |
| JP | 2006-191081 A | 7/2006 |
| JP | 2008300613 A | 12/2008 |
| JP | 2010-067844 A | 3/2010 |
| JP | 2010-514177 A | 4/2010 |
| JP | 2010-182958 A | 8/2010 |
| JP | 2010182958 A | 8/2010 |
| JP | 2010-245506 A | 10/2010 |
| JP | 2011096851 A | 5/2011 |
| JP | 2011-159958 A | 8/2011 |
| JP | 2012-033878 A | 2/2012 |

OTHER PUBLICATIONS

Masahiko Yasuda; "Notification of Reasons for Refusal;" for Patent Application No. 2012-043962; dated Jan. 10, 2017; pp. 1-30.

\* cited by examiner

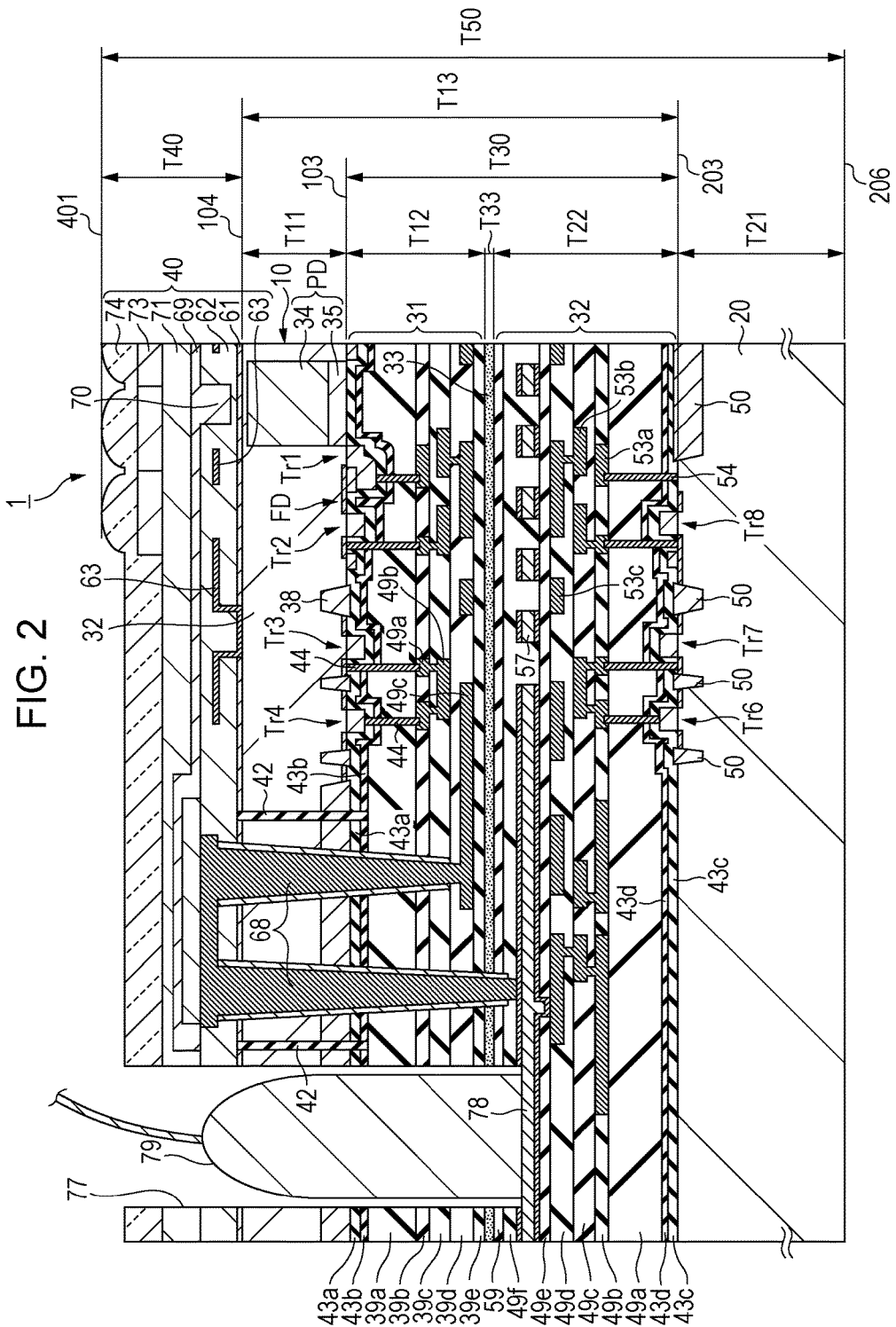

PHOTOELECTRIC CONVERSION DEVICE, IMAGE PICKUP SYSTEM AND METHOD OF MANUFACTURING PHOTOELECTRIC CONVERSION DEVICE

CROSS-REFERENCE TO RELATED APPLICATION

This application is Continuation of U.S. application Ser. No. 14/685,337, filed Apr. 13, 2015, which is a Continuation of U.S. application Ser. No. 14/514,090, filed Oct. 14, 2014, now U.S. Pat. No. 9,029,241 issued May 12, 2015, which is a Divisional of U.S. application Ser. No. 13/774,150, filed Feb. 22, 2013, now U.S. Pat. No. 8,890,331 issued Nov. 18, 2014, which claims priority from Japanese Patent Application No. 2012-043962 filed Feb. 29, 2012, which are hereby incorporated by reference herein in their entireties.

BACKGROUND OF THE INVENTION

Field of the Invention

One disclosed aspect of the embodiments relates to a photoelectric conversion device which includes a plurality of semiconductor substrates.

Description of the Related Art

In a related art photoelectric conversion device, a photoelectric conversion unit including a plurality of photoelectric conversion elements, a signal processing unit for processing an electrical signal from the photoelectric conversion unit, and a control unit for controlling the photoelectric conversion unit and the signal processing unit are monolithically mounted on a single semiconductor substrate. It has been demanded to increase an area of the photoelectric conversion unit, to reduce the area of the photoelectric conversion device and to achieve higher signal processing capability. In Japanese Patent Laid-Open No. 2011-159958, it is discussed to stack a plurality of semiconductor substrates, to provide a photoelectric conversion unit in one of the semiconductor substrates and provide a signal processing unit in the other of the semiconductor substrate.

Since the signal processing unit is driven at higher speed (at higher frequency) than the photoelectric conversion unit, the power consumed in the signal processing unit is larger than that consumed in the photoelectric conversion unit. Generated heat becomes greater in proportion to the consumed power. If a plurality of semiconductor substrates are stacked, since these semiconductor substrates are positioned close to each other, an influence of generation of heat of the signal processing unit becomes significant as compared with a case in which the photoelectric conversion unit and the signal processing unit are mounted monolithically on a single semiconductor substrate.

SUMMARY OF THE INVENTION

A first aspect of the technique for solving the aforementioned problem is a photoelectric conversion device which includes: a first semiconductor substrate which includes a photoelectric conversion unit for generating signal charge in accordance with incident light; and a second semiconductor substrate which includes a signal processing unit for processing an electrical signal on the basis of the signal charge, the signal processing unit being situated in an orthogonal projection area from the photoelectric conversion unit to the second semiconductor substrate, and a multilayer film including a plurality of insulator layers being provided between the first semiconductor substrate and the second semiconductor substrate, wherein the thickness of the second semiconductor substrate is smaller than 500 micrometers, and the thickness of the second semiconductor substrate is greater than the distance between the second semiconductor substrate and a light-receiving surface of the first semiconductor substrate.

A second aspect of the technique for solving the aforementioned problem is a method of manufacturing a photoelectric conversion device which includes: a bonding process in which a first member including a first semiconductor wafer on which a plurality of photoelectric conversion element groups are arranged and a first film including an insulator layer and provided on a front surface of the first semiconductor wafer, and a second member including a second semiconductor wafer on which a plurality of semiconductor device groups are arranged and a second film including an insulator layer and provided on a front surface of the second semiconductor wafer are bonded to each other with the first film and the second film being disposed between the first semiconductor wafer and the second semiconductor wafer to prepare a composite member: a first thinning process in which, after the bonding process, the first semiconductor wafer of the composite member is thinned from a back surface side of the first semiconductor wafer; and a second thinning process in which, after the first thinning process, the second semiconductor wafer of the composite member is thinned from a back surface side of the second semiconductor wafer, wherein: the thickness of the second semiconductor wafer after the thinning is smaller than 500 micrometers and the thickness of the second semiconductor wafer after the thinning is greater than the distance between the back surface of the first semiconductor wafer after the thinning and the surface of the second semiconductor wafer.

According to those techniques, a photoelectric conversion device in which the influence of generation of heat of the signal processing unit is reduced may be provided.

Further features of the disclosure will become apparent from the following description of exemplary embodiments with reference to the attached drawings.

BRIEF DESCRIPTION OF THE DRAWINGS

FIGS. 3A-1 to 3D-2 are schematic diagrams of the photoelectric conversion device.

DESCRIPTION OF THE EMBODIMENTS

Figure 1A:
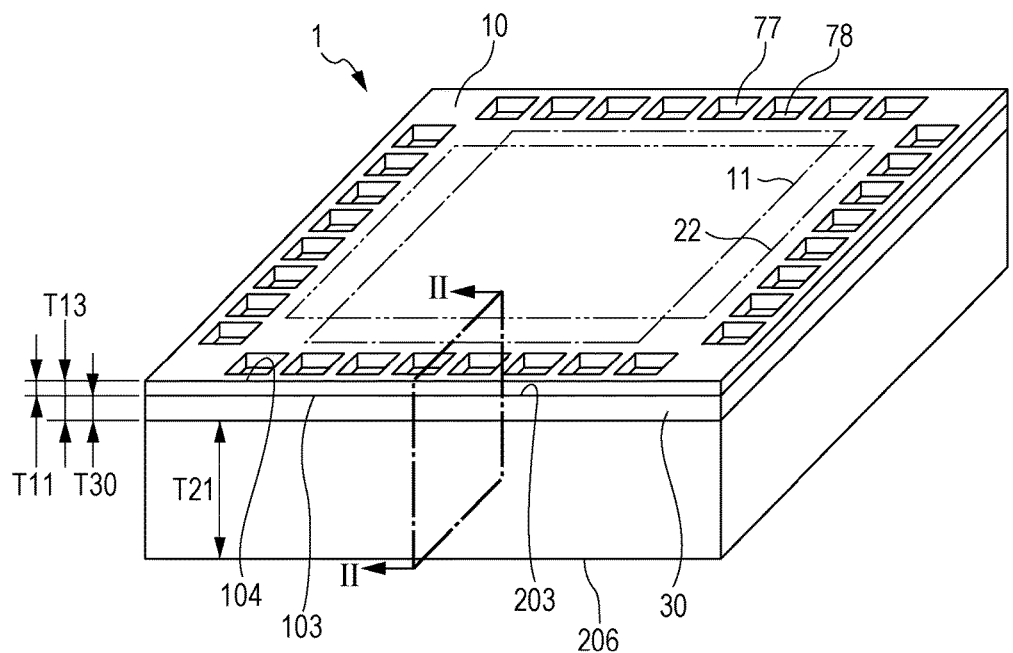
FIGS. 1A to 1C are schematic diagrams of a main part of a photoelectric conversion device.

Hereinafter, an exemplary embodiment will be described with reference to the drawings. In the following description and drawings, a plurality of drawings may be mutually referred to. The same or similar configurations are denoted by common reference numerals and description of configurations denoted by the common reference numerals is omitted appropriately.

First Embodiment

Figure 1B:
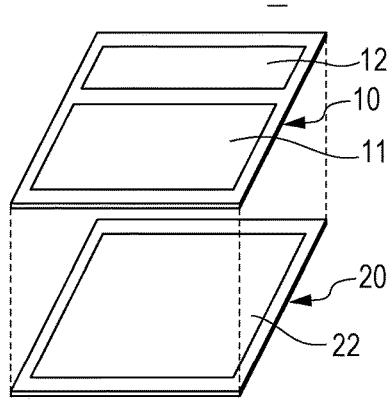
Figure 1C:
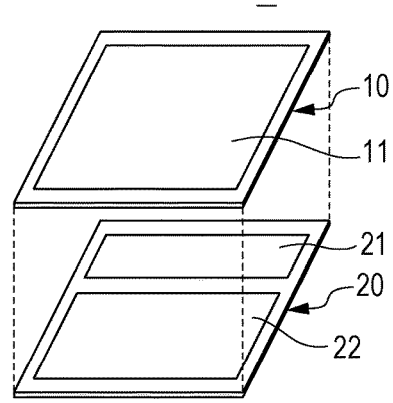

A photoelectric conversion device will be described briefly. FIG. 1A is a perspective view of a semiconductor device 1 which is a main part of the photoelectric conversion device. FIGS. 1B and 1C are exploded perspective views of an exemplary semiconductor device 1. As illustrated in FIG. 1A or 1B, in the semiconductor device 1 illustrated in FIG. 1A, a first semiconductor substrate 10 is stacked on a second semiconductor substrate 20 in an electrically-connected manner.

The semiconductor device 1 includes a first semiconductor substrate 10 which includes a photoelectric conversion unit 11 in which signal charge is generated in accordance with incident light. The photoelectric conversion unit 11 is constituted by a plurality of photoelectric conversion elements which are arranged in two dimensions. The photoelectric conversion elements may be photodiodes and photogates. The photoelectric conversion unit 11 may include a signal generating circuit which generates an electrical signal on the basis of the signal charge generated in the photoelectric conversion element. The signal generating circuit may be constituted by a transfer transistor, an amplifying transistor and a reset transistor.

The semiconductor device 1 includes a second semiconductor substrate 20 which includes a signal processing unit 22. The signal processing unit 22 processes the electrical signal on the basis of the signal charge generated in the photoelectric conversion unit 11. In FIG. 1A, the photoelectric conversion unit 11 is surrounded by a dash-dot line and the signal processing unit 22 is surrounded by a dash-dot-dot line. The signal processing unit 22 is situated in an orthogonal projection area from the photoelectric conversion unit 11 to the second semiconductor substrate 20. The signal processing unit 22 may include a noise reduction circuit, an amplifier circuit, a conversion circuit and an image signal processing circuit. The noise reduction circuit is, for example, a correlation double sampling (CDS) circuit. The amplifier circuit is, for example, a sequential amplifier circuit. The conversion circuit is, for example, an analog-to-digital conversion (ADC) circuit constituted by a comparator and a counter. The image signal processing circuit, which includes, for example, memory and a processor, generates image data from digital signals which has been converted from analog signals, and performs image processing to the image data. The entire or a part of the signal processing unit 22 may be situated in the entire orthogonal projection area from the photoelectric conversion unit 11 to the second semiconductor substrate 20. Alternatively, the entire or a part of the signal processing unit 22 may be situated in a part of the orthogonal projection area from the photoelectric conversion unit 11 to the second semiconductor substrate 20. FIG. 1A illustrates an example in which a part of the signal processing unit 22 is situated in a part of the orthogonal projection area from the photoelectric conversion unit 11 to the second semiconductor substrate 20. A part of the signal processing unit 22 may be provided in the first semiconductor substrate 10. For example, the signal processing unit for analog signals, such as the noise reduction circuit and the amplifier circuit, may be provided in the first semiconductor substrate 10, and the signal processing unit for digital signals, such as the conversion circuit and the image signal processing circuit, may also be provided in the second semiconductor substrate 20.

A multilayer film 30 including a plurality of insulator layers is provided between the first semiconductor substrate 10 and the second semiconductor substrate 20. The multilayer film 30 may include a plurality of conductor layers. The conductor layer of the multilayer film 30 functions as wiring of an electric circuit provided in the first semiconductor substrate 10 and the second semiconductor substrate 20, and wiring which connects an electric circuit provided in the first semiconductor substrate 10 and an electric circuit provided in the second semiconductor substrate 20.

As illustrated in FIGS. 1B and 1C, the semiconductor device 1 may further include a control unit which controls the photoelectric conversion unit 11 and the signal processing unit 22. The control unit may be provided in at least one of the first semiconductor substrate 10 and the second semiconductor substrate 20. In the example illustrated in FIG. 1B, a control unit 12 is provided in the first semiconductor substrate 10. In the example illustrated in FIG. 1C, a control unit 21 is provided in the second semiconductor substrate 20. Alternatively, a control unit for the photoelectric conversion unit 11 may be provided in the first semiconductor substrate 10 and another control unit for the signal processing unit 22 may be provided in the second semiconductor substrate 20. The control unit 12 may include a vertical driving circuit and a power circuit. The vertical driving circuit supplies a drive signal to a pixel circuit via a vertical scanning line. The control unit 21 may include timing generating circuit for driving the signal processing unit 22, a reference signal supply circuit for supplying a reference signal to the conversion circuit, and a horizontal scanning circuit for sequentially reading signals from the supply circuit and the amplifier circuit.

A light control film, which is not illustrated, for controlling light to the photoelectric conversion unit 11 may be provided on the first semiconductor substrate 10. The light control film may include a color filter array, a microlens array and a light blocking layer.

In FIG. 1A, the thickness of the first semiconductor substrate 10 is denoted by T11, the thickness of the second semiconductor substrate 20 is denoted by T21 and the thickness of the multilayer film 30 is denoted by T30. The thickness T11 of the first semiconductor substrate 10 is the distance between a front surface 103 of the first semiconductor substrate 10 and a back surface 104 of the first semiconductor substrate 10. The thickness T21 of the second semiconductor substrate 20 is the distance between a front surface 203 of the second semiconductor substrate 20 and a back surface 206 of the second semiconductor substrate 20. The thickness T30 is substantially equal to the distance between the front surface 103 of the first semiconductor substrate 10 and the front surface 203 of the second semiconductor substrate 20. The distance from the second semiconductor substrate 20 and a light-receiving surface of the first semiconductor substrate 10, i.e., the distance between the back surface 104 of the first semiconductor substrate 10, which is the light-receiving surface of the first semiconductor substrate 10, and the front surface 203 of the second semiconductor substrate 20 is denoted by T13. The distance T13 is substantially equal to the sum of the thickness T11 and the thickness T30. The thickness T21 of the second semiconductor substrate 20 is greater than the distance T13 between the light-receiving surface (i.e., the back surface 104) of the first semiconductor substrate 10, and the second semiconductor substrate 20 (T13<T21). Desirably, the thickness T21 of the second semiconductor substrate 20 is greater than 20 micrometers. The thickness T21 of the second semiconductor substrate 20 is smaller than 500 micrometers. If the second semiconductor substrate 20 is a silicon substrate, it is desirable that the thickness T21 of the second semiconductor substrate 20 is equal to or smaller than 400 micrometers. It is desirable that the thickness T21 of the second semiconductor substrate 20 is equal to or greater than 10 times the thickness T11 of the first semiconductor substrate 10. It is desirable that the thickness T21 of the second semiconductor substrate 20 is equal to or smaller than 100 times the thickness T11 of the first semiconductor substrate 10.

An example of the semiconductor device 1 will be described with reference to FIG. 2. FIG. 2 is a cross-sectional view of the semiconductor device 1 along a surface including a point P and a point Q illustrated in FIG. 1A.

The first semiconductor substrate 10 includes a photodiode PD which includes an n-type semiconductor region 34 and a p-type semiconductor region 35 as photoelectric conversion elements of the photoelectric conversion unit 11. The photodiode PD is provided in a p-type semiconductor region 32. A MOS transistor Tr1 as the transfer transistor and a MOS transistor Tr2 as the reset transistor are provided in the photoelectric conversion unit 11 of the first semiconductor substrate 10. MOS transistors Tr3 and Tr4 as the semiconductor devices which constitute the control unit of the first semiconductor substrate 10 are provided in the photoelectric conversion unit 11. In this example, a part of the front surface 103 of the first semiconductor substrate 10 is constituted by the p-type semiconductor region 35 of the photodiode PD. A part of the front surface 103 of the first semiconductor substrate 10 forms an interface with gate dielectric films of the MOS transistors Tr1, Tr2, Tr3 and Tr4. A device separating portion 38 is provided in the first semiconductor substrate 10. The device separating portion 38 is provided to a deeper position of the first semiconductor substrate 10 than the front surface 103 of the first semiconductor substrate 10 and is made to protrude from the front surface 103 of the first semiconductor substrate 10. Insulator layers 43a and 43b as protective layers for protecting the front surface 103 of the first semiconductor substrate 10 are provided on the first semiconductor substrate 10. Insulator layers 39a, 39b, 39c, 39d and 39e are provided on the insulator layer 43b as inter-layer insulator layers. A conductor layer 44 as a contact plug and a plurality of conductor layers 49a, 49b and 49c as wiring layers are provided on the first semiconductor substrate 10. The conductor layer 44 is made of tungsten and the wiring layers 49a, 49b and 49c are made of copper. The plurality of insulator layers 43a, 43b, 39a, 39b, 39c, 39d and 39e and the plurality of conductor layers 44, 49a, 49b and 49c constitute a first multilayer film 31.

The second semiconductor substrate 20 includes MOS transistors Tr6, Tr7 and Tr8 as semiconductor devices which constitute the signal processing unit. In this example, a part of the front surface 203 of the second semiconductor substrate 20 forms an interface with gate dielectric films of the MOS transistors Tr6, Tr7 and Tr8. A device separating portion 50 is provided in the second semiconductor substrate 20. The device separating portion 50 is provided to a deeper position of the second semiconductor substrate 20 than the front surface 203 of the second semiconductor substrate 20 and is made to protrude from the front surface 203 of the second semiconductor substrate 20. Insulator layers 43c and 43d as protective layers for protecting the front surface 203 of the second semiconductor substrate 20 are provided on the second semiconductor substrate 20. Insulator layers 49a, 49b, and 49c, 49d, 49e and 49f are provided on the insulator layer 43d as inter-layer insulator layers. An insulator layer 59 is provided on the inter-layer insulator layer 49f as a stress relaxation layer. A conductor layer 54 as a contact plug and a plurality of conductor layers 53a, 53b, 53c and 57 as wiring layers are provided on the second semiconductor substrate 20. The conductor layer 54 is made of tungsten, the conductor layers 49a, 49b and 49c are made of copper and the conductor layer 57 is made of aluminum. The plurality of insulator layers 43c, 43d, 49a, 49b, 49c, 49d, 49e, 49f and 59 and the plurality of conductor layers 54, 53a, 53b, 53c and 57 constitute a second multilayer film 32. The second multilayer film 32 covers the front surface 203 of the second semiconductor substrate 20.

The insulator layer 39e of the first multilayer film 31 and the insulator layer 59 of the second multilayer film 32 are bonded via an adhesive layer 33. The first multilayer film, the second multilayer film and the adhesive layer 33 correspond to the multilayer film 30 illustrated in FIG. 1A. In this manner, the first semiconductor substrate 10 and the second semiconductor substrate 20 are bonded to each other via the multilayer film 30.

A bonding electrode 68 which penetrates the first semiconductor substrate 10 and connects the conductor layer 49c and the conductor layer 57 to each other is provided. The bonding electrode 68 is made of copper or tungsten. The bonding electrode 68 is surrounded by an insulating spacer 42. The photoelectric conversion unit 11 and the signal processing unit 22, the photoelectric conversion unit 11 and the control unit 21, and the control unit 12 and the signal processing unit 22 are electrically connected by the bonding electrode 68.

A light control film 40 including antireflection layer 61, a clad layer 62, a light blocking layer 63, a core layer 69, a flattening layer 71, a color filter array 73 and a microlens array 74 is provided on the side of the back surface 104 of the first semiconductor substrate 10. The refractive index of the core layer 69 is higher than the refractive index of the clad layer 62. An optical waveguide 70 which guides light by total reflection is formed on the core layer 69. The light control film 40 is in contact with the p-type semiconductor region 32 which constitutes the light-receiving surface (i.e., the back surface 104) of the first semiconductor substrate 10. A surface 401 of the light control film 40 on the side opposite to the first semiconductor substrate 10 is a light input surface of the light control film. In this example, the light input surface is constituted by the microlens array 74.

An electrode pad 78 is arranged on a layer at the same level as that of the conductor layer 57 and is made of aluminum. An opening 77 which penetrates a plurality of insulator layers, the first semiconductor substrate 10 and the light control film 40 is provided on the electrode pad 78. A bonding wire 79 connected to the electrode pad 78 is provided in the opening 77.

The semiconductor device 1 of this example constitutes a back surface irradiation type photoelectric conversion device in which a surface (i.e., the back surface 104) of the first semiconductor substrate 10 opposite to the side on which the transistors Tr1 to Tr4 are provided (i.e., the front surface 103) is the light-receiving surface. The semiconductor device 1 may be a front surface irradiation type photoelectric conversion device in which the surface of the first semiconductor substrate 10 on which the transistors Tr1 to Tr4 are provided (i.e., the front surface 103) is used as the light-receiving surface. In the back surface irradiation type photoelectric conversion device, the thickness T11 of the first semiconductor substrate 10 is smaller than 10 micrometers and is typically 3 to 5 micrometers.

In FIG. 2, the thickness T11 of the first semiconductor substrate 10, the thickness T21 of the second semiconductor substrate 20 and the distance T30 between the first semiconductor substrate 10 and the second semiconductor substrate 20 are illustrated. The distance T13 between the light-receiving surface of the first semiconductor substrate 10 and the second semiconductor substrate 20 is the sum of the thickness T11 and the distance T30. In this example, the thickness T12 of the first multilayer film 31 equals to the sum of the thickness of the insulator layers 43a, 43b, 39a, 39b, 39c, 39d and 39e. In this example, the thickness T22 of the second multilayer film 32 equals to the sum of the thickness of the insulator layers 43c, 43d, 49a, 49b, 49c, 49d, 49e, 49f and 59. The thickness of the adhesive layer 33 is denoted by T33. T30 is the sum of T12, T22 and T33. The sum of the thickness T40 of the light control film 40, T13 and T21 equals to the thickness T50 of the entire semiconductor device 1 (T50=T40+T13+T21=T40+T11+T30+T21).

FIG. 2 illustrates an example in which the first multilayer film 31 and the second multilayer film 32 are bonded using the adhesive layer 33. However, it is also possible an insulator layer of the first multilayer film 31 and an insulator layer of the second multilayer film 32 are directly bonded by, for example, plasma bonding. Alternatively, it is also possible that a conductor layer of the first multilayer film 31 and a conductor layer of the second multilayer film 32 are directly bonded by metal bonding. Desirably, the conductor layer to be metal bonded is made of copper. Thus, if direct bonding is used, the thickness T30 of the multilayer film 30 equals to the sum of the thickness T31 of the first multilayer film 31 and the thickness T32 of the second multilayer film 32.

As described above, an influence of generation of heat in the signal processing unit 22 may be reduced by setting T13<T21. The reason thereof will be described below. The following are the influence of generation of heat in the signal processing unit 22. For example, heat distribution in a path to the first semiconductor substrate 10 from the signal processing unit 22. Insulating materials (i.e., a plurality of insulator layers) of which thermal conductivity is generally lower than that of a semiconductor are situated in this path. Typically, a plurality of silicon oxide layers (thermal conductivity: 1.5 W/m·K) of which thermal conductivity is lower than that of the silicon substrate (thermal conductivity: 150 W/m·K) and a plurality of silicon nitride layers (thermal conductivity: 30 W/m·K) are situated. Thermal conductivity mentioned here is an example. Therefore, heat distribution in the multilayer film 30 is that the temperature is higher in the side of the second semiconductor substrate 20 than in the side of the first semiconductor substrate 10. This heat distribution produces thermal stress in the semiconductor device 1, which may cause warpage of the semiconductor device 1 or peeling of a bonding surface (in this example, the adhesive layer 33). Typically, the multilayer film 30 includes an electric conductor (i.e., a plurality of conductor layers) of which thermal conductivity is generally higher than that of a semiconductor. For the reduction of transmission of heat from the signal processing unit 22 to the photoelectric conversion unit 11 via the electric conductor with high thermal conductivity, it is desirable to set the density of the electric conductor in the multilayer film 30 to be lower than the density of the insulating material.

It has been known generation of heat in the signal processing unit 22 mainly occurs at a position very close to the front surface 203 of the second semiconductor substrate 20. The cause thereof is estimated to be, for example, current leakage in the MOS transistor. Then, on the basis of the front surface 203 of the second semiconductor substrate 20, the relationship between T13 and T21, which are included in the thickness T50 of the semiconductor device 1, is set to T13<T21. T13 corresponds to the distance between the front surface 203 of the second semiconductor substrate 20 and the light-receiving surface of the first semiconductor substrate 10. T21 corresponds to the distance between the front surface 203 of the second semiconductor substrate 20 and the back surface 206 of the second semiconductor substrate 20. Then, the second semiconductor substrate 20 is provided with the mechanical strength to solve the problem described above. If the thickness T21 of the second semiconductor substrate 20 is greater than 50 micrometers, sufficient mechanical strength may be obtained and, therefore, it is more desirable to set the thickness T21 of the second semiconductor substrate 20 to be equal to or greater than 100 micrometers.

On the other hand, if the thickness of the second semiconductor substrate 20 is excessively large, heat in the front surface 203 of the second semiconductor substrate 20 is not easily radiated from the back surface 206 of the second semiconductor substrate 20. Heat-radiating ability may be improved practically by setting the thickness of the second semiconductor substrate 20 to be smaller than 500 micrometers. If the second semiconductor substrate 20 is a silicon substrate, it has been known that the thickness T21 of the second semiconductor substrate 20 is desirably equal to or smaller than 400 micrometers when a simulation calculation result on the basis of thermal resistance of silicon is considered.

Since the first semiconductor substrate 10 is situated between the light control film 40 and the second semiconductor substrate 20, the light control film 40 does not have a large influence on the problem described above. However, if the stress of the entire semiconductor device 1 is considered, it is not desirable that the thickness T40 of the light control film 40 is excessively large. It is desirable that T40 is not greater than the distance T30 between the first semiconductor substrate 10 and the second semiconductor substrate 20 (T40<T30). It is also desirable that the sum of T40 and T13 is smaller than T21 (T40+T13<T21). Although the thickness T50 of the entire semiconductor device 1 is typically smaller than 1000 micrometers, restrictions of packaging which will be described later in the second embodiment may be reduced by setting the thickness T50 to be smaller than 500 micrometers. The size of the general photoelectric conversion unit 11 in a direction perpendicular to the thickness direction (sectional direction) of the photoelectric conversion unit 11 (plane direction) is equal to or greater than 1.0 mm. Especially if the size of the photoelectric conversion unit 11 in the plane direction is equal to or greater than 5.0 mm, the influence of heat conduction in the sectional direction is greater than the influence of heat conduction in the plane direction. Therefore, the present embodiment is desirable. In a typical rectangular photoelectric conversion unit 11, the size in the plane direction corresponds to the diagonal length.

Second Embodiment

A configuration of a photoelectric conversion device 1000 which includes a semiconductor device 1 and a package 2 will be described with reference to FIGS. 3A-1 to 3D-2. In the present embodiment, the package 2 includes a fixing member 3, a transparent member 4, a support member 5 and a heat-conductive member 6. However, this configuration is not restrictive.

Figures 1, 3A:
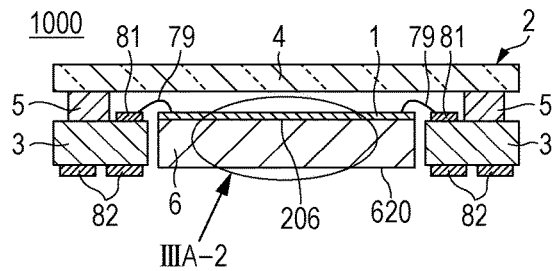
Figures 2, 3A:
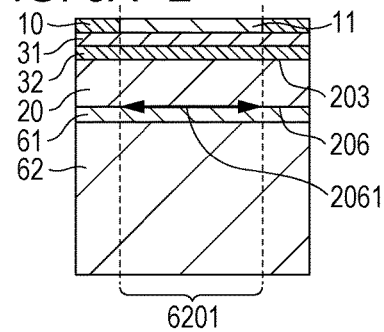

In a first example illustrated in FIG. 3A-1, a signal processing unit 22 of the semiconductor device 1 is connected to a first terminal 81 provided in the frame-shaped fixing member 3 by a bonding wire 79 which is connected to an electrode pad 78 of the semiconductor device 1. The fixing member 3 constitutes the package 2. The first terminal 81 is connected to the second terminal 82 by wiring which is not illustrated. In this example, the second terminal 82 includes a land grid array (LGA) structure. The second terminal 82 may include a ball grid array (BGA) structure or a pin grid array (PGA) structure. The package 2 includes the transparent member 4 which covers the semiconductor device 1. Although the transparent member 4 is a plate-shaped member in this example, the transparent member 4 may have a lens shape in order to condense the light on the semiconductor device 1. The transparent member 4 is supported by a support member 5 which is fixed to the fixing member 3.

Such a semiconductor device 1 of which thickness T50 is smaller than 1000 micrometers may be incorporated in an image pickup system as the photoelectric conversion device 1000 by using the package 2. In the incorporation in the image pickup system, the second terminal 82 is mounted on a mounting member which is not illustrated. The second terminal 82 may be mounted on a front surface of the mounting member or may be inserted in the mounting member. Mounting on the front surface is more desirable. A printed circuit board may be used as the mounting member. The printed circuit board may be a rigid board, such as a glass epoxy board, a flexible board, such as a polyimide board, or a flexible rigid board in which a rigid board and a flexible board are combined. The image pickup system may include a display unit for displaying image information obtained from the photoelectric conversion device 1000, and a recording unit for recording the image information. The display unit may be a touch panel. The image pickup system may be a camera, such as a still camera and a video camera. An information terminal having camera function may also be used. The image pickup system may include a communication unit which is connected to, for example, the Internet and a telephone line. FIG. 3A-2 is an enlarged view of a portion surrounded with a circle in FIG. 3A-1. A heat-conductive member 6 is provided on the side opposite to the first semiconductor substrate 10 via the second semiconductor substrate 20. The heat-conductive member 6 is situated at an opening of the frame-shaped fixing member 3 and is fixed to the fixing member 3 at a portion which is not illustrated. Since the heat-conductive member 6 is situated at the opening, an increase in the thickness of the photoelectric conversion device may be prevented.

This heat-conductive member 6 has thermal conductivity which is higher than that of an insulator layer of a multilayer film 30 and functions as a heat-radiation member (i.e., a heat sink or a heat spreader) for radiating heat of the semiconductor device 1. Typically, since the most part of the insulator layer is a silicon oxide layer, it is desirable that the heat-conductive member 6 is made of a material having thermal conductivity equal to or greater than 10 W/m·K. If the thermal conductivity of the insulator layer is anisotropic, the thermal conductivity of the insulator layer in the normal direction of the second semiconductor substrate 20 should be measured. The heat-conductive member 6 is provided in contact with an orthogonal projection area 2061 of a photoelectric conversion unit 11 of the first semiconductor substrate 10 on a back surface 206 which is a surface of the second semiconductor substrate 20 on the side opposite to the first semiconductor substrate 10. If the distance between the heat-conductive member 6 and the second semiconductor substrate 20 is shorter than the distance T30 between the first semiconductor substrate 10 and the second semiconductor substrate 20, it may be considered that the heat-conductive member 6 is in contact with the second semiconductor substrate 20. For example, the back surface 206 of the second semiconductor substrate 20 may be, in some cases, covered with an insulator film having thermal conductivity equal to or lower than the thermal conductivity of the insulator layer (e.g., a single layer film or a multilayer film including a silicon oxide layer and a silicon nitride layer). An air layer may exist between the heat-conductive member 6 and the second semiconductor substrate 20. In these cases, if the thickness of the insulator film or the air layer is smaller than T30 and the distance between the heat-conductive member 6 and the second semiconductor substrate 20 is smaller than T30, it may be considered that the heat-conductive member 6 is in contact with the second semiconductor substrate 20.

Desirably, the heat-conductive member 6 is a high heat-conductive member having thermal conductivity which is higher than the thermal conductivity of the second semiconductor substrate 20. If the second semiconductor substrate 2 is a silicon substrate, the heat-conductive member 6 is desirably made of, for example, aluminum (236 W/m·K) and copper (398 W/m·K).

Although the heat-conductive member 6 and the fixing member 3 are separated members here, these members may be integrated with each other by using, for example, ceramic. The heat-conductive member 6 may be a housing of the image pickup system.

As illustrated in FIG. 3A-2, the heat-conductive member 6 may be constituted by a plurality of portions. For example, the heat-conductive member 6 may be constituted by a first heat-conductive portion 61 having thermal conductivity which is higher than the thermal conductivity of the insulator layer of the multilayer film 30 and a second heat-conductive portion 62 having thermal conductivity which is higher than the thermal conductivity of the second semiconductor substrate 20. The thermal conductivity of the first heat-conductive portion 61 may be lower than the thermal conductivity of the second semiconductor substrate 20. For example, the first heat-conductive portion 61 is provided between the second semiconductor substrate 20 and the second heat-conductive portion 62 and the first heat-conductive portion 61 is made to be in contact with both the second semiconductor substrate 20 and the second heat-conductive portion 62. In this case, the first heat-conductive portion 61 is desirably film-shaped or sheet-shaped. Desirably, the distance TL between the first semiconductor substrate 10 and the second heat-conductive portion 62 (i.e., the thickness of the first heat-conductive portion 61) is smaller than the distance T30 between the first semiconductor substrate 10 and the second semiconductor substrate 20. With this configuration, thermal resistance between the second heat-conductive portion 62 and the second semiconductor substrate 20 may be set smaller than the thermal resistance between the first semiconductor substrate 10 and the second semiconductor substrate 20 (i.e., the thermal resistance of the multilayer film 30).

Figures 1, 3B:
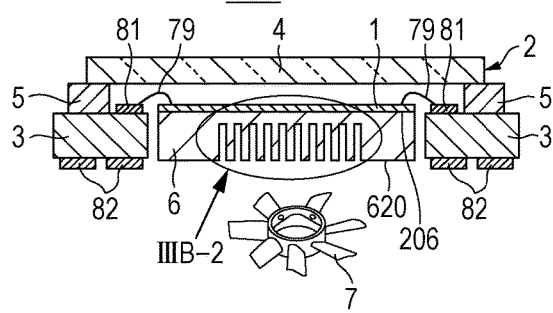
Figures 2, 3B:
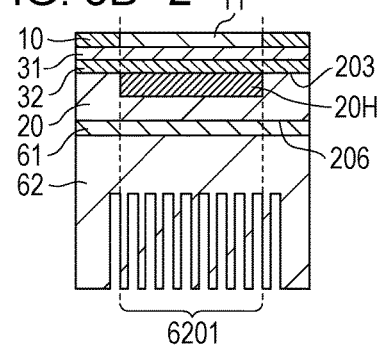
FIG. 2 is a schematic diagram of a main part of photoelectric conversion device.

A second example illustrated in FIGS. 3B-1 and 3B-2 is Modification of the first example. FIG. 3B-2 is an enlarged view of a portion surrounded with a circle in FIG. 3B-1. The heat-conductive member 6 (in this example, the second heat-conductive portion 62) includes a fin structure on a front surface 620 on the side opposite to the second semiconductor substrate 20. Therefore, a surface area of an orthogonal projection area 6201 from the second semiconductor substrate 20 is larger than a surface area of the back surface 206 which is a surface on the side of the heat-conductive member 6 of the second semiconductor substrate 20 on the front surface 620. Since the surface area of the orthogonal projection area 6201 is increased by the fin structure of the heat-conductive member 6, heat may be radiated efficiently. Although the fin structure which includes a plate-shaped projecting portion is described herein, was mentioned as example here, a needle point holder structure including bar-shaped projections may be used. The second semiconductor substrate 20, as in this example, may have variance of temperature in a board surface when being driven. It is effective to suppose that a high temperature portion 20H of which temperature is equal to or greater than an average temperature and a low temperature portion 20L of which temperature is lower than an average temperature are provided if the high temperature portion 20H is situated in the orthogonal projection area from the photoelectric conversion unit 11.

FIG. 3B-1 illustrates an example in which the image pickup system in which the photoelectric conversion device is incorporated includes a fan 7 as a cooling unit. The fan 7 may carry out forced cooling of the second semiconductor substrate 20 by carrying out forced cooling of the heat-conductive member 6 with air cooling. Water-cooling may be used for the forced cooling.

Figures 1, 3C:
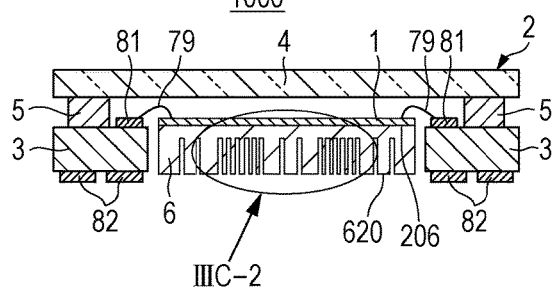
Figures 2, 3C:
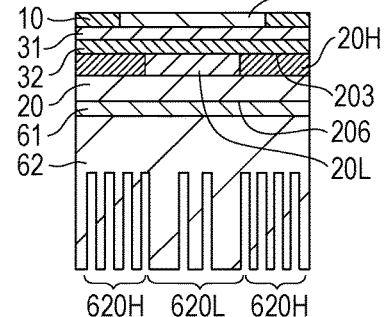

In a third example illustrated in FIG. 3C-1, between the high temperature portion 20H and the low temperature portion 20L of the second semiconductor substrate 20, the low temperature portion 20L is provided in the orthogonal projection area of the photoelectric conversion unit 11. FIG. 3C-2 is an enlarged view of a portion surrounded with a circle in FIG. 3C-1. At the design phase of a sensor device, site(s) and portion(s) at which heat is easily generated may be largely specified by simulation when the layout and the floor plan of the circuit block are determined. Generally, a horizontal scanning circuit and a counter circuit easily become the high temperature portion 20H. A surface area of the back surface 206 is large in an area 620H corresponding to the high temperature portion 20H and the surface area of the back surface 206 is smaller in an area 620L corresponding to the low temperature portion 20L than in the area 620H. With this configuration, variance of temperature in the second semiconductor substrate 20 is averaged.

Figures 1, 3D:
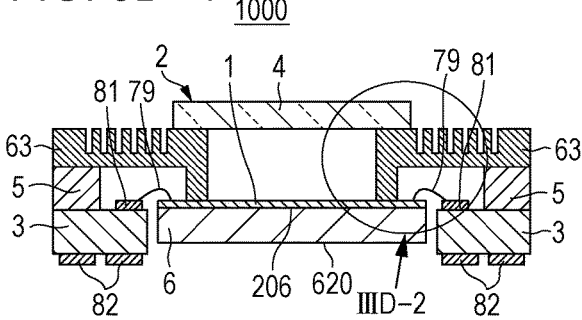
Figures 2, 3D:
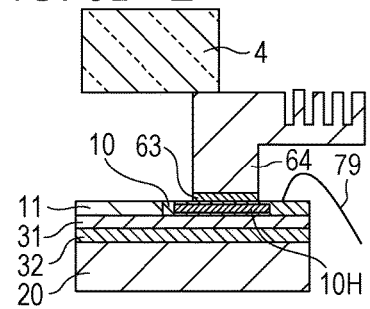

In a fourth example illustrated in FIG. 3D-1, a heat-conductive member 63 and a heat-conductive member 64 are connected to the first semiconductor substrate 10. This example is desirable in a case in which the first semiconductor substrate 10 includes a control unit 12 and the control unit 12 becomes the high temperature portion 10H of which temperature is higher than that of the photoelectric conversion unit 11. FIG. 3D-2 is an enlarged view of a portion surrounded with a circle in FIG. 3D-1. If the heat-conductive member 64 is disposed on the side of the first semiconductor substrate 10, it is important not to disturb incidence of light. If a lens is disposed in front of the semiconductor device 1, it is possible to know the maximum angle of incident light in accordance with the eye relief between the lens and the semiconductor device 1. Therefore, it is necessary to design the radiation mechanism in consideration of the angle.

Figure 4A:
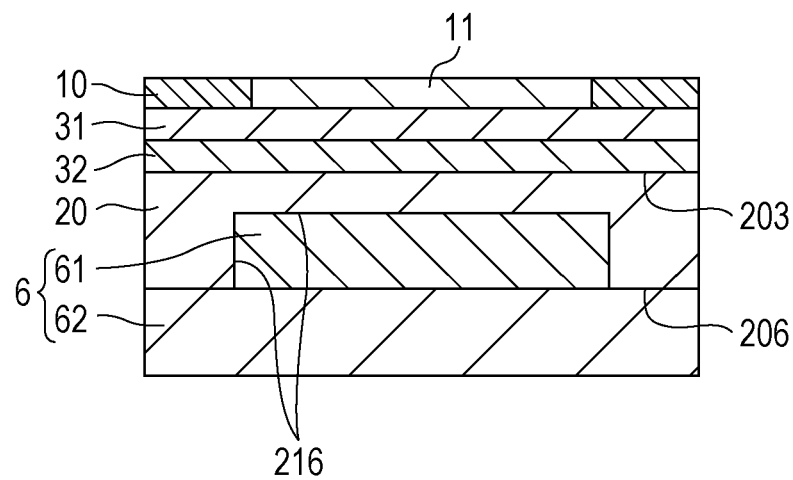
FIGS. 4A and 4B are schematic diagrams of the photoelectric conversion device.

FIG. 4A illustrates an example in which a recess 216 is formed in the second semiconductor substrate 20, the first heat-conductive portion 61 is disposed inside the recess 216 and the second heat-conductive portion 62 which is in contact with the first heat-conductive portion 61 is further provided.

Figure 4B:
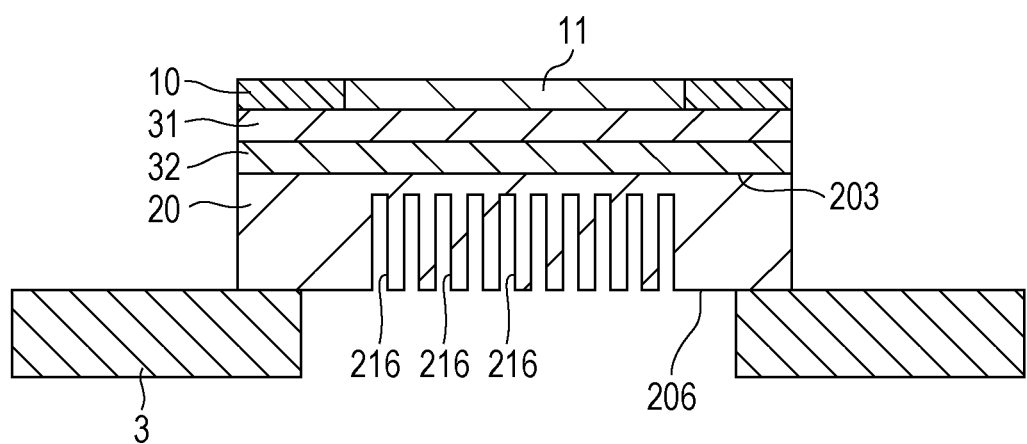
Figure 5A:
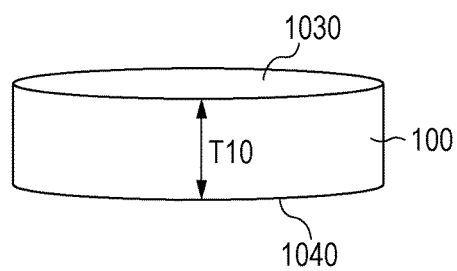
FIGS. 5A to 5J are schematic diagrams of a method of manufacturing the photoelectric conversion device.
Figure 5B:
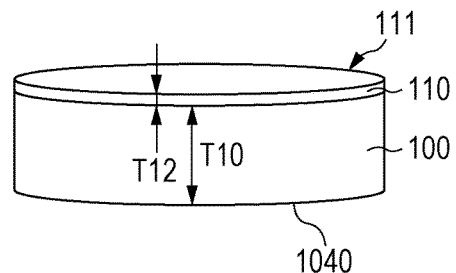
Figure 5C:
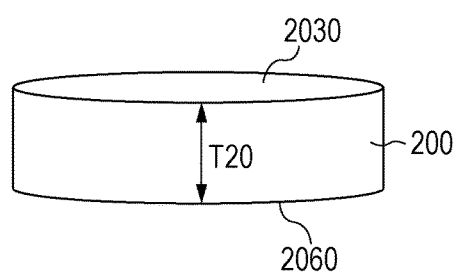
Figure 5D:
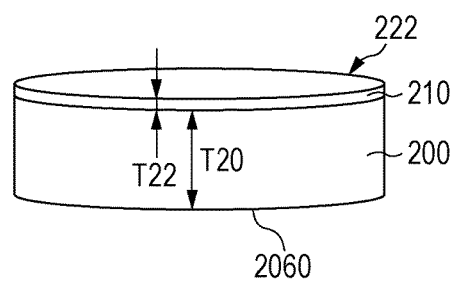
Figure 5E:
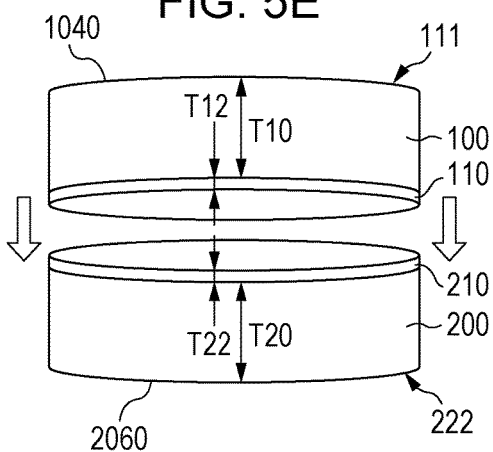
Figure 5F:
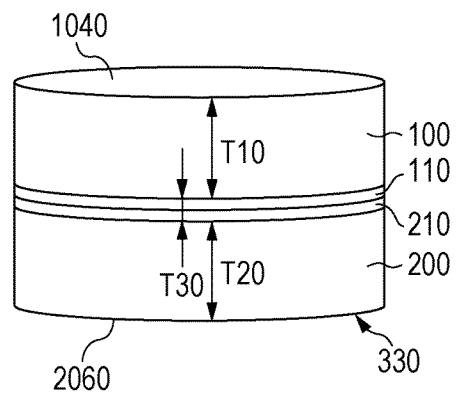
Figure 5G:
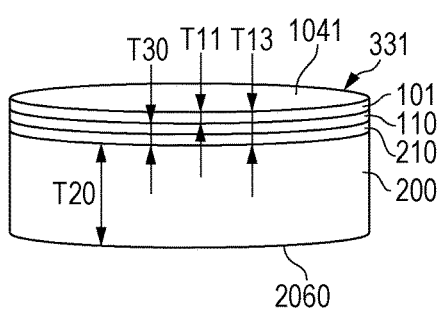
Figure 5H:
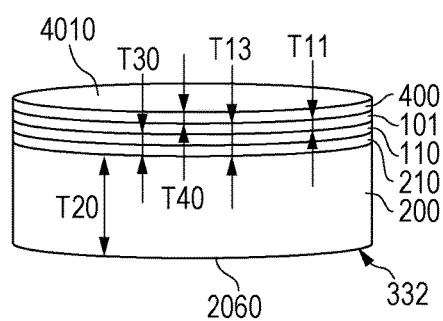
Figure 5I:
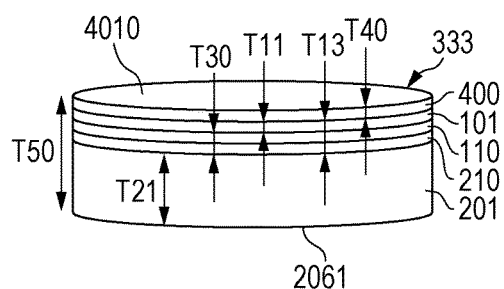
Figure 5J:
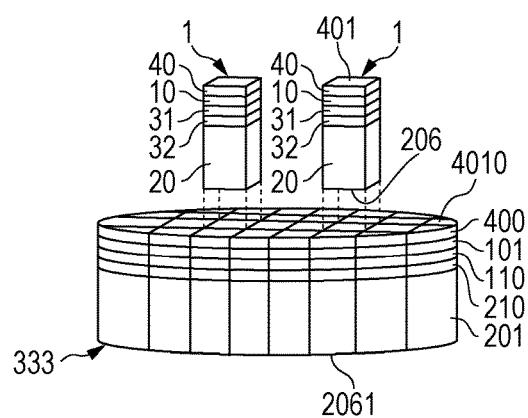

FIG. 4B illustrates an example in which no heat-conductive member 6 is provided and a plurality of recesses 216 are provided on the back surface 206 of the second semiconductor substrate 20. In this manner, radiation efficiency from the second semiconductor substrate 20 may be improved by setting the surface area of the back surface 206 of the second semiconductor substrate 20 greater than the surface area of a front surface 203 of the second semiconductor substrate 2. Desirably, the plurality of recesses 216 have a fin structure or a needle point holder structure.

In such a configuration in which no heat-conductive member 6 is provided, forced cooling of the second semiconductor substrate 20 may be carried out by air cooling.

Third Embodiment

A method of manufacturing a photoelectric conversion device will be described with reference to FIGS. 5A to 5J.
Process A Photoelectric conversion element groups (not illustrated) are formed in a plurality of areas on a front surface 1030 (i.e., front face) of the first semiconductor wafer 100 using a publicly known semiconductor device formation technique, such as ion implantation. Each of the photoelectric conversion element groups is constituted by a plurality of arranged photoelectric conversion elements (see FIG. 5A). The shape of a single crystal silicon wafer which is a typical semiconductor wafer is defined by the Semiconductor Equipment and Materials International (SEMI) standard. Hereinbelow, examples of dimensions of the silicon wafer practically used for the manufacture of the photoelectric conversion device among those defined by the SEMI standard will be described. In a wafer of which diameter is 150.000 (±0.20) mm, the thickness of the wafer center (center point) is 675 (±20) micrometers. In a wafer of which diameter is 200.000 (±0.20) mm, the thickness of the wafer center (center point) is 725 (±20) micrometers. In a wafer of which diameter is 300.000 (±0.20) mm, the thickness of the wafer center (center point) is 775 (±20) micrometers. The values with ± in the parenthesis are common differences. Either of these thickness values may be used as the thickness T10 of the first semiconductor wafer 100.
Process B After the process A, a first multilayer film 110 which includes a plurality of insulator layers and a plurality of conductor layers is formed on the front surface 1030 of the first semiconductor wafer 100 using a publicly known multilayer interconnection technique. The thickness of the first multilayer film 110 is T12. T12 is typically smaller than T10 (T12<T10). All the layers of the plurality of conductor layers may be made of the same material or made of different materials. For example, aluminum layers and copper layers may be used in a mixed manner. In this manner, the first semiconductor wafer 100 and a first member 111 which includes the first multilayer film 110 stacked on the first semiconductor wafer 100 are prepared (see FIG. 5B). The thickness of the first member 111 is the sum of T10 and T12.
Process C Semiconductor device groups (not illustrated) are formed in a plurality of areas on a front surface 2030 (i.e., front face) of the second semiconductor wafer 200 using a publicly known semiconductor device formation technique, such as ion implantation. Each of the plurality of semiconductor device groups is constituted by arranged semiconductor devices (see FIG. 5C). The thickness T20 of the second semiconductor wafer 200 may be the thickness defined by the SEMI standard like the thickness T10 of the first semiconductor wafer 100. Desirably, the first semiconductor wafer 100 and the second semiconductor wafer 200 are the same in diameter.
Process D After the process C, a second multilayer film 210 which includes a plurality of insulator layers and a plurality of conductor layers is formed on the front surface 2030 of the second semiconductor wafer 200 using a publicly known multilayer interconnection technique. The thickness of the second multilayer film 210 is T22. T22 is typically smaller than T20 (T22<T20). All the layers of the plurality of conductor layers may be made of the same material or made of different materials. For example, aluminum layers and copper layers may be used in a mixed manner. In this manner, the second semiconductor wafer 200 and a second member 222 which includes the second multilayer film 210 stacked on the second semiconductor wafer 200 are prepared (see FIG. 5D). The thickness of the first member 111 is the sum of T10 and T12. The order of the process B and the process D is not particularly limited: the process B and the process D may be performed in parallel.

Process E

Preparation for a bonding process described in the next process E is made in at least one of the first member 111 and the second member 222. In this example, an adhesive is applied to at least one of a front surface of the first multilayer film 110 or a front surface of the second multilayer film 220 which are bonding surfaces of the first member 111 and the second member 222. In plasma bonding is carried out, at least one of an insulator layer of the surface of the first multilayer film 110 and an insulator layer of the surface of the second multilayer film 220 is subject to plasma processing. The first member 111 and the second member 222 are stacked to each other with the first multilayer film 110 and the second multilayer film 120 being disposed between the first semiconductor wafer 100 and the second semiconductor wafer 200 (see FIG. 5E). At this time, the first member 111 and the second member 222 are aligned with each other using alignment marks which are previously formed at both the first member 111 and the second member 222.

Process F

After the process E, the first member 111 and the second member 222 are bonded to each other while keeping the state in which the first multilayer film 110 and the second multilayer film 120 are disposed between the first semiconductor wafer 100 and the second semiconductor wafer 200. In this example, as described in the process E, since the adhesive which is not illustrated is used for bonding the first member 111 and the second member 222, the first member 111 and the second member 222 are bonded by a solidification process of the adhesive. The solidification process may be a photo-curing process, a heat-curing process and a drying process. Pressure may be applied to the first member 111 and to the second member 222 if necessary. By this process F which is the bonding process, a composite member 330 in which the first member 111 and the second member 222 are bonded to each other is manufactured. The sum of the thickness T12 of the first multilayer film 110, the thickness of the adhesive layer and the thickness T22 of the second multilayer film 210 equals to the distance T30 between the first semiconductor wafer 100 and the second semiconductor wafer 200.

Process G

After the process F, the first semiconductor wafer 100 of the composite member 330 is thinned from the side of a back surface 1040 of the first semiconductor wafer 100. Then, a composite member 331 of which first semiconductor wafer is thinned than that of the composite member 330 is obtained. A method of thinning the first semiconductor wafer 100 may be, for example, chemical machinery polishing (CMP), mechanical polishing (MP), wet etching and dry etching. These methods may be used in combination. By this process F which is a first thinning process, the first semiconductor wafer 100 which has had the thickness T10 until the process F becomes a first semiconductor wafer 101 which has the thickness T11 (T11<T10). The first semiconductor wafer 100 which includes the back surface 1040 becomes the first semiconductor wafer 101 which includes a back surface 1041. The distance T13 between a front surface of the second semiconductor wafer 200 (i.e., a front surface 2030) and a front surface of the first semiconductor wafer 110 (i.e., a front surface 1030) equals to the sum of the distance T30 and the thickness T11. The thickness T11 of the first semiconductor wafer 101 is equal to or smaller than 10 micrometers and typically is 3 to 5 micrometers.

Process H

After the process G, bonding electrode(s) (not illustrated) for connecting the conductor layer of the first multilayer film 110 and the conductor layer of the second multilayer film 210 are formed if necessary. The bonding electrodes may be provided by penetrating the first semiconductor wafer 101 or, alternatively, by previously removing a part of the first semiconductor wafer 101, disposing the insulator layer at the portion from which the first semiconductor wafer 101 is removed, and penetrating the insulator layer. Details of the formation method of the bonding electrodes are provided in Japanese Patent Laid-Open No. 2011-96851, Japanese Patent Laid-Open No. 2011-151375 and Japanese Patent Laid-Open No. 2011-204915.

A light control film 400 which includes at least one of a color filter array, a microlens array and a light blocking layer is formed on the back surface 1041 of the first semiconductor wafer 101. Then, a composite member 332 of which thickness is greater than that of the composite member 331 by the thickness of the light control film 400 is obtained. The color filter array may include a light transmission unit which transmits red light, green light and blue light which are the primary lights and, in addition to that, a light transmission unit which transmits white light or complementary color light of the primary lights. The microlens array may be formed by reflowing or by etchback. However, gradual exposure is desirable from the viewpoint of reducing the damage to the first semiconductor wafer 101. The thickness T40 of the light control film 400 is not particularly limited. Desirably, however, T40 is not greater than the distance T30 between the first semiconductor wafer 101 and the second semiconductor wafer 200 (T40<T30). Although the process of forming the light control film 400 is desirably performed after the process of forming the bonding electrode(s), these processes may be performed in reverse order. A surface 4010 of the light control film 400 becomes a light input surface.

Process I

After the process H, the second semiconductor wafer 200 of the composite member 332 is thinned from a back surface 2060 side of the second semiconductor wafer 200. Then, a composite member 333 of which second semiconductor wafer 200 is thinner than that of the composite member 332 is obtained. A method of thinning the second semiconductor wafer 200 may be, for example, chemical machinery polishing (CMP), mechanical polishing (MP), wet etching and dry etching. These methods may be used in combination. By this process I which is a second thinning process, the second semiconductor wafer 200 which has had the thickness T20 until the process H becomes a second semiconductor wafer 201 which has the thickness T21 (T21<T20). Desirably, the thickness T21 is smaller than 500 micrometers. The second semiconductor wafer 200 which includes the back surface 2060 becomes the second semiconductor wafer 201 which includes a back surface 2061. Typically, the thickness T21 of the second semiconductor wafer 201 after the thinning process is equal to or smaller than half the thickness T20 of the second semiconductor wafer 200 before the thinning process. If the second semiconductor wafer 200 is a silicon wafer, the thickness T21 of the second semiconductor wafer 201 is desirably equal to or smaller than 400 micrometers. It is important to set the thickness T21 to be greater than the distance T13 between the back surface 1041 of the first semiconductor wafer 101 and the front surface 2030 of the second semiconductor wafer 200 (i.e., the second semiconductor wafer 201). If the damage to the semiconductor device group formed in the second semiconductor wafer is considered in accordance with the result of the X-ray topography analysis, the thickness T21 of the second semiconductor wafer 201 is desirably equal to or greater than 20 micrometers, and is more desirably equal to or greater than 50 micrometers.

If the thickness of the second semiconductor wafer is relatively thick (for example, equal to or greater than 300 micrometers), the thinning process is desirably performed by mechanical polishing in consideration of the thinning speed. On the other hand, if the thickness of the second semiconductor wafer is relatively thin (for example, less than 300 micrometers), the thinning process is desirably performed by chemical machinery grinding in consideration of the damage to the semiconductor device group by the thinning. For example, if a silicon wafer which is 300 mm in diameter is used as a second semiconductor wafer 200, mechanical polishing is used in a stage of thinning 775 micrometers to 300 micrometers and chemical machinery grinding is used in a stage of thinning from 300 micrometers to 50 micrometers. Further thinning may be performed by wet etching.

Process J

After the process I, the composite member 333 is divided into a plurality of semiconductor devices 1 each including a photoelectric conversion element group and a semiconductor device group. The dividing process of this dividing process may be performed by blade dicing using a dicing blade (a dicing saw). Laser dicing using a laser beam may also be used. Although the dividing process is desirably performed from the first semiconductor wafer 101 side of the composite member 333, it is also possible to be performed from the second semiconductor wafer 201 side. By performing the dividing process while the relationship of T21>T13 is satisfied, the second semiconductor wafer 201 substantially supports the rigidity of the composite member 333, whereby the dividing process may be performed suitably. It is also possible to support the rigidity by increasing the thickness of the first semiconductor wafer 101. However, since a plurality of photoelectric conversion element groups are disposed on the first semiconductor wafer 101, suitable thickness T11 of the first semiconductor wafer 101 is determined by the photoelectric conversion performance. Therefore, there is a limit to the increase in thickness for the enhancement of rigidity. On the other hand, since the second semiconductor wafer 201 has less such limitation, it is desirable to increase the thickness of the second semiconductor wafer 201. It is also possible to provide a support member for supporting the composite member 333 at the time of the dividing process if necessary. If the thickness T50 of the composite member 333 is equal to or greater than 50 micrometers, the dividing process may be performed with a possibility that chipping or peeling of the bonding surface is caused being reduced as much as possible even if the blade dicing is used. If thickness T50 of the composite member 333 is less than 50 micrometers, a possibility that chipping or peeling of the bonding surface is caused is reduced when the laser dicing is used.

Process K

After the process J, packaging of each of the plurality of semiconductor devices 1 is carried out. Heat-conductive die bond paste is applied to at least one of the heat sink as the second heat-conductive portion 62, and the back surface 206 of the second semiconductor substrate 20 of the semiconductor device 1 illustrated in FIG. 3A-1, the dye bond paste is solidified, and then a heat-conductive film as the first heat-conductive portion 61 is formed. Then, the back surface 206 is fixed to the heat sink and thermal connection between the heat sink and the semiconductor device 1 is obtained in addition to mechanical connection.

Formation of the recesses 216 illustrated in FIGS. 4A and 4B may be performed after the thinning process of the second semiconductor wafer 200. For example, after the second thinning process, a silicon oxide film is formed by, for example, CVD on the back surface 2061 of the second semiconductor wafer 201. Then, the silicon oxide film is patterned at a desired position using a resist pattern by dry etching. Next, the silicon is etched to desired depth by wet etching using the patterned silicon oxide film as a hard mask using, for example, an alkaline etchant, such as TMAH and KOH. Alternatively, the recesses 216 may be formed by dry etching in the silicon substrate by repeating etching using gas of which principal component is $SF_6$ and etching using gas of which principal component is $C_4F_6$.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A device, comprising:
    a first semiconductor substrate which includes a photoelectric conversion unit where a plurality of photoelectric conversion elements and a first plurality of transistors are arranged, the first semiconductor substrate having a first surface and a second surface opposite to the first surface of the first semiconductor substrate, the first plurality of transistors being on the first surface of the first semiconductor substrate;
    a second semiconductor substrate which includes a signal processing unit where a second plurality of transistors are arranged, the second semiconductor substrate having a first surface and a second surface opposite to the first surface of the second semiconductor substrate, the second plurality of transistors being on the first surface of the second semiconductor substrate;
    conductor layers and insulator layer arranged between the conductor layers; and
    a lens array arranged on the second surface of the first semiconductor substrate,
    wherein the first semiconductor substrate is stacked on the second semiconductor substrate so that the conductor layers and the insulator layer are arranged between the first plurality of transistors and the second plurality of transistors, and
    wherein a distance between the first surface of the second semiconductor substrate and the second surface of the second semiconductor substrate is greater than a distance between the first surface of the second semiconductor substrate and a light input surface of the lens array.

2. The device according to claim 1, wherein the second surface of the first semiconductor substrate is a light receiving surface of the first semiconductor substrate, a thickness of the second semiconductor substrate is greater than 10 times a thickness of the first semiconductor substrate and is smaller than 100 times the thickness of the first semiconductor substrate.

3. The device according to claim 2, wherein an opening is provided to penetrate the first semiconductor substrate.

4. The device according to claim 3, further comprising
a first multilayer film arranged between the first semiconductor substrate and the second semiconductor substrate, the first multilayer film including at least three of the conductor layers; and
a second multilayer film arranged between the first multilayer film and the second semiconductor substrate, the second multilayer film including at least four of the conductor layers,
wherein a conductor layer of the first multilayer film and a conductor layer of the second multilayer film are electrically connected to each other.

5. The device according to claim 4, further comprising an electrode which penetrates the first semiconductor substrate and electrically connects the conductor layer of the first multilayer film and the conductor layer of the second multilayer film.

6. The device according to claim 1, wherein the first semiconductor substrate and the second semiconductor substrate are silicon substrates, a thickness of the second semiconductor substrate is greater than 100 micrometers and smaller than 400 micrometers.

7. The device according to claim 6, wherein the conductor layers includes a layer made of copper.

8. The device according to claim 7, wherein the signal processing unit of the second semiconductor substrate includes an image signal processing circuit that generates image data from digital signals.

9. The device according to claim 8, wherein the photoelectric conversion unit of the first semiconductor substrate includes a signal generating circuit which generates an electrical signal on the basis of the signal charge generated in the photoelectric conversion element, the signal generating circuit comprising a transfer transistor, an amplifying transistor and a reset transistor.

10. The device according to claim 9, wherein the signal processing unit of the second semiconductor substrate includes a counter of an analog-to-digital conversion circuit.

11. The device according to claim 10, wherein the signal processing unit of the second semiconductor substrate includes a comparator of the analog-to-digital conversion circuit in the second semiconductor substrate.

12. The device according to claim 1, wherein a thickness of the first semiconductor substrate is smaller than 10 micrometers, a thickness of the second semiconductor substrate is greater than 50 micrometers, and the thickness of the second semiconductor substrate is smaller than 300 micrometers.

13. The device according to claim 12, wherein a distance between the light input surface of the lens array and the second surface of the first semiconductor substrate is not greater than a distance between the first surface of the first semiconductor substrate and the first surface of the second semiconductor substrate.

14. A system comprising:
the device according to claim 1; and
a circuit board,
wherein the device further a transparent member arranged over the lens array, and a terminal electrically connected to the circuit board.

15. The system according to claim 14, further comprising:
a display unit for displaying image information obtained from the semiconductor device.

16. The system according to claim 15, wherein the display unit is a touch panel.

17. A device comprising:
a first semiconductor substrate which includes a photoelectric conversion unit where a plurality of photoelectric conversion elements are arranged, the first semiconductor substrate having a first surface and a second surface opposite to the first surface of the first semiconductor substrate, the second surface of the first semiconductor substrate being a light receiving surface of the first semiconductor substrate;
a second semiconductor substrate which includes a signal processing unit where a plurality of transistors are arranged, the second semiconductor substrate having a first surface and a second surface opposite to the first surface of the second semiconductor substrate, the plurality of transistors being on the first surface of the second semiconductor substrate; and
a lens array arranged on the second surface of the first semiconductor substrate,
wherein the first semiconductor substrate is stacked on the second semiconductor substrate,
wherein a distance between the first surface of the second semiconductor substrate and the second surface of the second semiconductor substrate is greater than a distance between the first surface of the second semiconductor substrate and a light input surface of the lens array,
wherein a thickness of the first semiconductor substrate is smaller than 10 micrometers, a thickness of the second semiconductor substrate is greater than 50 micrometers, and the thickness of the second semiconductor substrate is smaller than 300 micrometers,
wherein a distance between the light input surface of the lens array and the second surface of the first semiconductor substrate is not greater than a distance between the first surface of the first semiconductor substrate and the first surface of the second semiconductor substrate, and
wherein the photoelectric conversion unit is a rectangular photoelectric conversion unit, and a diagonal length of the rectangular photoelectric conversion unit is greater than 5.0 mm.

18. The device according to claim 17, wherein a distance between the light input surface of the lens array and the second surface of the second semiconductor substrate is smaller than 500 micrometers.

19. The device according to claim 18, further comprising a color filter array arranged on the first semiconductor substrate, wherein the color filter array includes a light transmission unit which transmits white light.

20. A system comprising:
a device;
a circuit board;
a display unit for displaying image information obtained from a semiconductor device, the display unit being a touch panel; and
a communication unit that provide a connection to the Internet,
wherein the device, comprising:
a first semiconductor substrate which includes a photoelectric conversion unit where a plurality of photoelectric conversion elements are arranged, the first semiconductor substrate having a first surface and a second surface opposite to the first surface of the first semiconductor substrate, the second surface of the first semiconductor substrate being a light receiving surface of the first semiconductor substrate;

a second semiconductor substrate which includes a signal processing unit where a plurality of transistors are arranged, the second semiconductor substrate having a first surface and a second surface opposite to the first surface of the second semiconductor substrate, the plurality of transistors being on the first surface of the second semiconductor substrate;

a lens array arranged on the second surface of the first semiconductor substrate;

a transparent member arranged over the lens array; and a terminal electrically connected to the circuit board;

wherein the first semiconductor substrate is stacked on the second semiconductor substrate, and wherein a distance between the first surface of the second semiconductor substrate and the second surface of the second semiconductor substrate is greater than a distance between the first surface of the second semiconductor substrate and a light input surface of the lens array.

21. The system according to claim 20, wherein a thickness of the first semiconductor substrate is smaller than 10 micrometers, a thickness of the second semiconductor substrate is greater than 50 micrometers, and a thickness of the second semiconductor substrate is smaller than 300 micrometers.

22. The system according to claim 20, wherein the photoelectric conversion unit is a rectangular photoelectric conversion unit, and a diagonal length of the rectangular photoelectric conversion unit is greater than 5.0 mm.

* * * * *